United States Patent

[11] 3,629,720

[72] Inventors Adel S. Sedra
66 Pacific Avenue #1412, Toronto, 65;
Kenneth C. Smith, 92 Pettit Drive, Weston,
Ontario, both of Canada

[21] Appl. No. 18,930
[22] Filed Mar. 12, 1970
[45] Patented Dec. 21, 1971
[73] Assignee Canadian Patents and Development
Limited, Ottawa, Canada

[54] DIGITALLY CONTROLLED VARIABLE-GAIN LINEAR DC AMPLIFIER
4 Claims, 2 Drawing Figs.

[52] U.S. Cl. .... 330/86, 330/110, 330/145
[51] Int. Cl. .... H03g 3/00
[50] Field of Search .... 330/29, 86, 110, 130,140, 144–146

[56] References Cited

UNITED STATES PATENTS 3,451,006 6/1969 Grangaard .... 330/29 X
3,376,557 4/1968 Goinez .... 330/86 UX
3,177,350 4/1965 Abbott et al. .... 330/86 X

*Primary Examiner*—Roy Lake
*Assistant Examiner*—James B. Mullins
*Attorney*—James R. Hughes ABSTRACT: A digitally controlled variable gain linear DC amplifier consisting of a resistance bridge in which the resistance of one arm is determined by "*n*" binary weighted resistors connected in parallel and adapted to be switched in or out of the circuit by a *n*-bit binary control signal has its output connected to the input of an operational amplifier having a feedback resistor of equal value to the resistance of one arm of the bridge. The gain of the amplifier is determined by the resistance value of the "*n*" binary weighted resistors in relation to the resistances in the other arms of the bridge and the feedback-resistance of the amplifier.

INVENTORS
ADEL S. SEDRA
KENNETH C. SMITH
BY [signature]
PATENT AGENT

DIGITALLY CONTROLLED VARIABLE-GAIN LINEAR DC AMPLIFIER

This invention relates to a digitally controlled variable gain linear DC amplifier.

In designing programmable waveform generators, the problem arises of digitally controlling the signal amplitude. It would be desirable to have an operational amplifier with feedback impedance whose gain is controllable in digital terms from a binary signal source. The standard form of device of this nature is an operational amplifier whose resistance feedback path is a series of resistors having binary values e.g. one, two, four, eight resistance units that may be switched in or out by a binary switching signal source. This type of circuit suffers from certain drawbacks, the chief of which is that one end of the controlling resistance chain will not be at ground.

The present invention provides a simple DC amplifier whose gain is controllable from a *n*-bit binary signal having an accuracy within ±1 percent of its nominal value within the range of ±0.1 v. to about ±10 v. One resistor only is controlled in a simple binary weighted fashion with one end of this resistor being grounded making switching easy.

Figure 1:
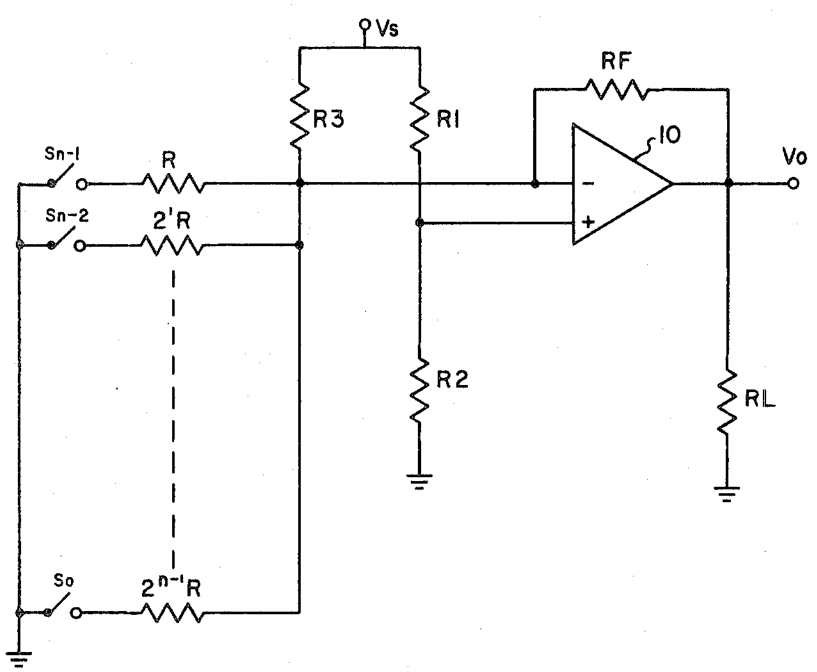
Figure 2:
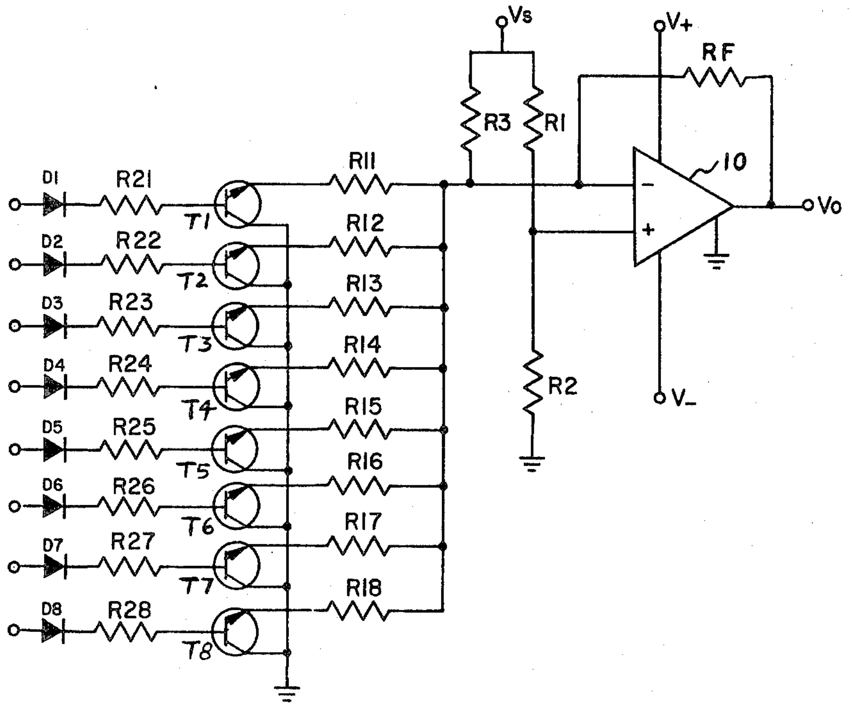

In drawings which illustrate an embodiment of the invention,

FIG. 1 is a schematic circuit with a simplified input switching arrangement and FIG. 2 is a complete circuit showing a preferred input switching arrangement.

Referring to FIG. 1 an operational amplifier 10 has a resistance feedback path RF, output $V_o$, and output load resistor RL. The input voltage $V_s$ is connected via potential divider resistors R1 and R2 to ground with their junction point connected to the noninverting input of the amplifier 10. As R1 and R2 are made equal (and equal to RF), one-half of the input signal $V_s$ is fed to the amplifier. The inverting terminal of the amplifier is connected to the signal source $V_s$ through resistance R3 equal in value to the feedback resistance RF and to ground by a series of binary weighted resistors R, $2^1$R,...$2^{n-1}$R through switches $S_o$ ... $S_{n-1}$ which would be controlled by the *n*-bit binary control signal.

The required transfer-function desired for the system may be defined as:

$$V_o = KPV_s \qquad (1)$$

where the amplifier gain $G = V_o/V_s$ is given by $$G = KP \qquad (2)$$

Where $K$ is a constant representing the size of the step variation in gain and $P$ is the decimal equivalent of the binary control signal. For an *n*-bit binary signal, $P$ is given by $$P = 2^o S_o + 2^1 1 + 2^2 s_2 + \dots 2^{n-1} S_{n-1} \qquad (3)$$

Where each $S$ assumes the value 0 or 1 according to its corresponding bit.

Assuming an ideal differential amplifier with infinite gain and infinite input impedance it can be shown that $$V_o = \frac{RF}{2nR} PV_s \qquad (4)$$

It will be realized that the voltage difference at the input of the operational amplifier, because of its infinite gain, must be substantially zero and, therefore, the current flowing in the feedback path through resistor $RF$ must be such as to compensate for any imbalance in the input circuitry which might be considered as a form of bridge. Assuming the total resistance provided by the switching network to be $R_s$ and the current to ground through this network to be $I_s$ and R1=R2 and R3=RF then $$\tfrac{1}{2}V_s = I_s R_s$$

and $$I_s = \frac{\tfrac{1}{2}V_s}{R3} + I_{RF}$$

where $I_{RF}$ is the feedback current through resistor RF $$\therefore I_{RF} = \frac{\tfrac{1}{2}V_s}{R_s} - \frac{\tfrac{1}{2}V_s}{RF}$$

and $$I_{RF} = \frac{V_o - \tfrac{1}{2}V_s}{RF}$$

$$\therefore \frac{\tfrac{1}{2}V_s}{R_s} - \frac{\tfrac{1}{2}V_s}{RF} = \frac{V_o}{RF} - \frac{\tfrac{1}{2}V_s}{RF}$$

$$\frac{\tfrac{1}{2}V_s}{R_s} = \frac{V_o}{RF}$$

$$V_o = \frac{RF}{2R_s} V_s \qquad (5)$$

This shows the circuit gain is proportional to the ratio of the feedback-resistance and the resistance provided by the switching network. Equation (5) is the basis of operation of the device; equation (4) given earlier gives the operation of the terms of the binary input control and the appropriate gain steps which are given by $$K = \text{ti } RF/2^n R \qquad (6)$$

Referring to FIG. 2 a complete circuit is shown with the switches replaced by bipolar transistors T1 and T8 connected in the inverted mode as shown. Control input in the form of an eight-bit binary signal fed through diodes D1 to D8 and resistors R21 and R28 activate the transistors, effectively switching resistors R11 to R18 into the circuit as appropriate.

The operational amplifier used for the circuit described here should have very low offset current and voltage as it is assumed that the inverting terminal potential will track that of the noninverting one at all signal levels. The amplifier should have low capacitance between both input terminals and ground otherwise large errors would be expected for AC input signals. The circuit bandwidth is a function of the operational amplifier used and therefore it should be chosen to satisfy the frequency characteristics desired. Operational amplifiers suitable for purposes of this circuit are commercially available.

In choosing the resistor values used, it is preferable that the highest value of the binary weighted series, corresponding to the least significant bit, should be low enough to ensure current value much larger than the sum of the reverse currents of all the off switches. For an eight-bit control signal, let $R$=500 ohms for example. The highest resistance would then be 64k. If the desired gain step $K$=0.1, then using equation (6), $RF$=12.8of course, must be used.

The circuit described herein will have many applications. In addition to use in programmable waveform generators, it is foreseen that it may be used as a multiplying *d–a* converter, a particular waveform generator, an amplitude sweep circuit, a conic display generator, a digital filter control, and various other hybrid analog-digital computing schemes.

What is claimed is:

1. A digitally controlled variable gain linear DC amplifier comprising:
   a. an operational amplifier having a feedback resistor,
   b. a voltage divider network of first and second resistors in series and equal in value, with the midpoint connected to the noninverting input of the amplifier such that one half of any input voltage connected across the resistors in series would be applied to the amplifier,
   c. a third resistor equal in value to the feedback resistor,
   d. a series of "*n*" binary weighted resistors in series with switching devices connected in parallel to provide an overall resistance whose value is determined by the condition of the switching devices, said switching devices adapted to be operable by a "*n*"-bit switching control signal,
   e. said third resistor and said overall resistance connected in series with the junction point connected to the inverting input of the amplifier and adapted to be connected to an input voltage of equal magnitude of that applied to the first and second resistors.

2. A digitally controlled variable gain linear DC amplifier comprising:
   a. a resistance bridge adapted for connection to a supply voltage, with two adjacent arms containing resistors of equal value, a third arm containing a resistor of known value, and a fourth arm having a resistance value determined by "$n$" binary weighted resistors connected in parallel and adapted to be switched in or out of the circuit by a $n$-bit binary control signal such as to alter the resistance value of the fourth arm in relation to the magnitude of the binary control signal, and b. an operational amplifier having a feedback resistor of equal value to the third arm resistor in the bridge and having its inverting and noninverting terminals connected across the output terminals of the bridge.

3. A digitally controlled variable gain linear DC amplifier as in claim 2 wherein the "$n$" binary weighted resistors are each connected to a switching transistor connected in the inverted mode and adapted to be controlled by the appropriate signal bit of the "$n$" bit binary control signal.

4. A circuit as in claim 2 wherein the feedback resistor and the resistors in three arms of the bridge are all equal in value.

* * * * *